United States Patent [19]

Grassauer

[11] Patent Number: 4,646,435
[45] Date of Patent: Mar. 3, 1987

[54] CHIP CARRIER ALIGNMENT DEVICE AND ALIGNMENT METHOD

[75] Inventor: Willie K. Grassauer, Mapleton, Oreg.

[73] Assignee: Raychem Corporation, Menlo Park, Calif.

[21] Appl. No.: 784,406

[22] Filed: Oct. 4, 1985

[51] Int. Cl.[4] .......................... H05K 3/34; B23P 19/00
[52] U.S. Cl. .......................................... 29/840; 29/759; 174/52 FP; 228/180.2
[58] Field of Search .......................... 29/840, 759, 760; 179/68.5; 228/180.2, 44.1; 339/17 CF

[56] References Cited

U.S. PATENT DOCUMENTS 4,352,449 10/1982 Hall et al. ..................... 228/180.2 X
4,371,912 2/1983 Guzik ............................ 228/180.2 X
4,479,298 10/1984 Hug ........................................ 29/589
4,512,509 4/1985 Ellis, Jr. et al. .................. 228/180.2

Primary Examiner—Howard N. Goldberg
Assistant Examiner—Carl J. Arbes
Attorney, Agent, or Firm—T. Gene Dillahunty; Herbert G. Burkard; James W. Peterson

[57] ABSTRACT

A device and method for aligning and assembling castellated chip carriers with other electrical components such as printed circuit boards or other chip carriers is disclosed. The device provides means for compressively engaging the castellations in the chip carrier thereby providing precise alignment and positioning of the chip carriers relative to other components with which it is assembled. A method utilizing the device and a solder column placement device to produce a preleaded castellated chip carrier is also disclosed.

16 Claims, 4 Drawing Figures

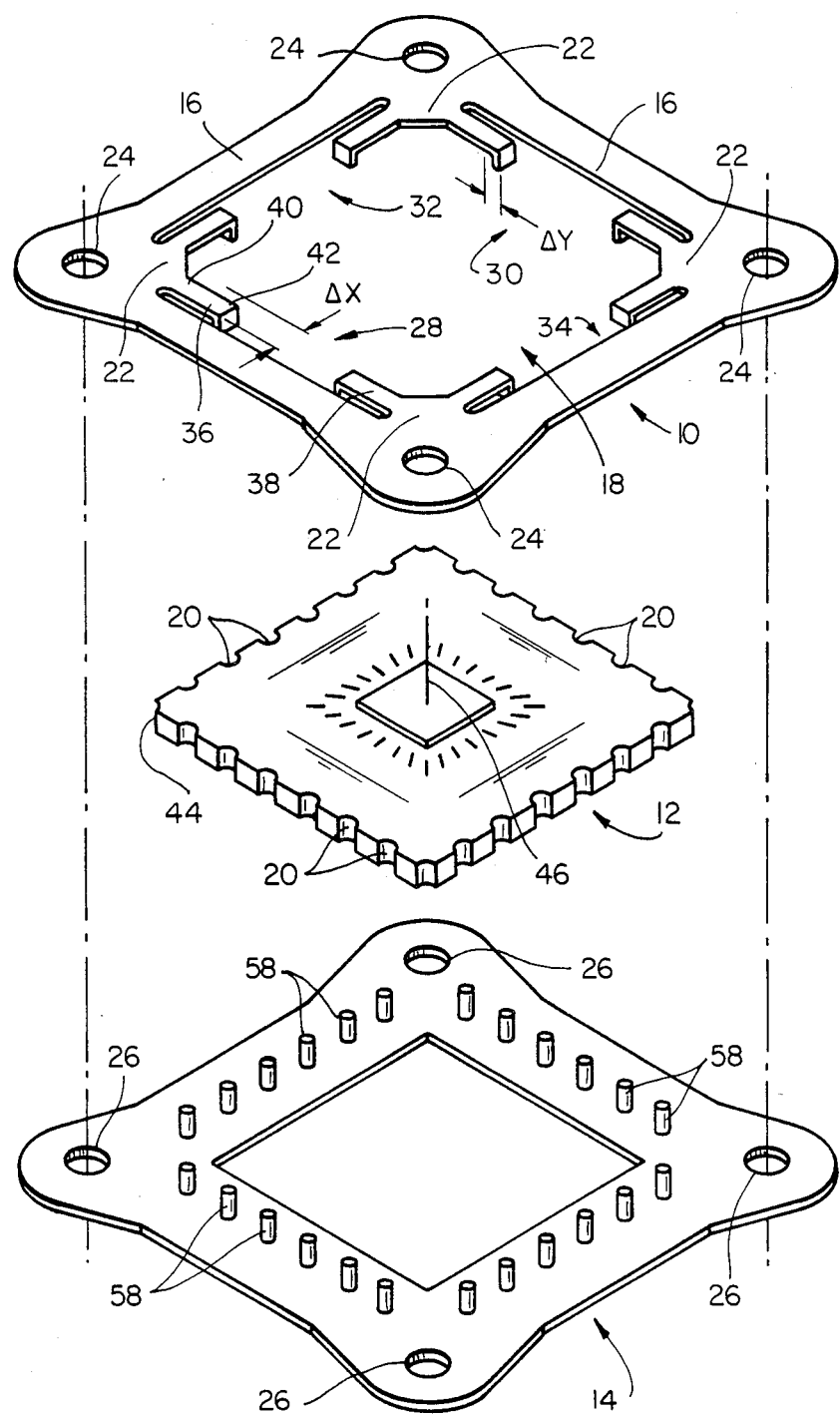
FIG_1

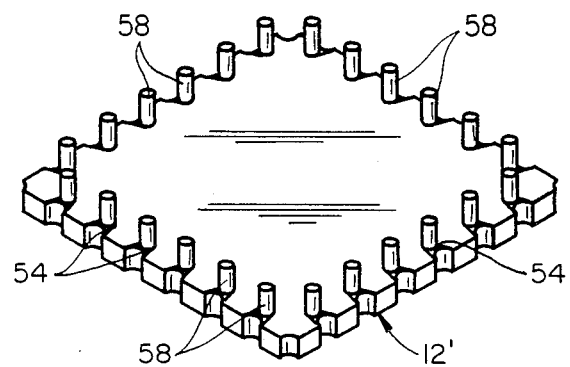
FIG_2
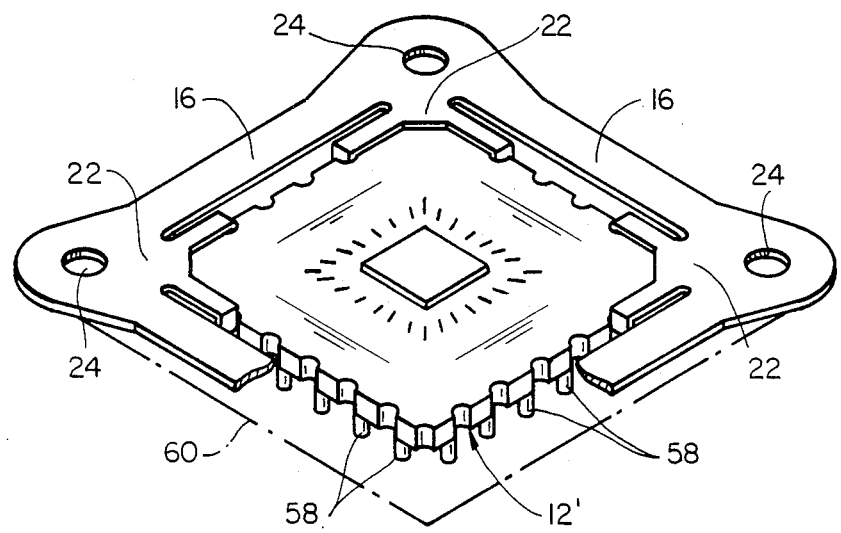
FIG_3

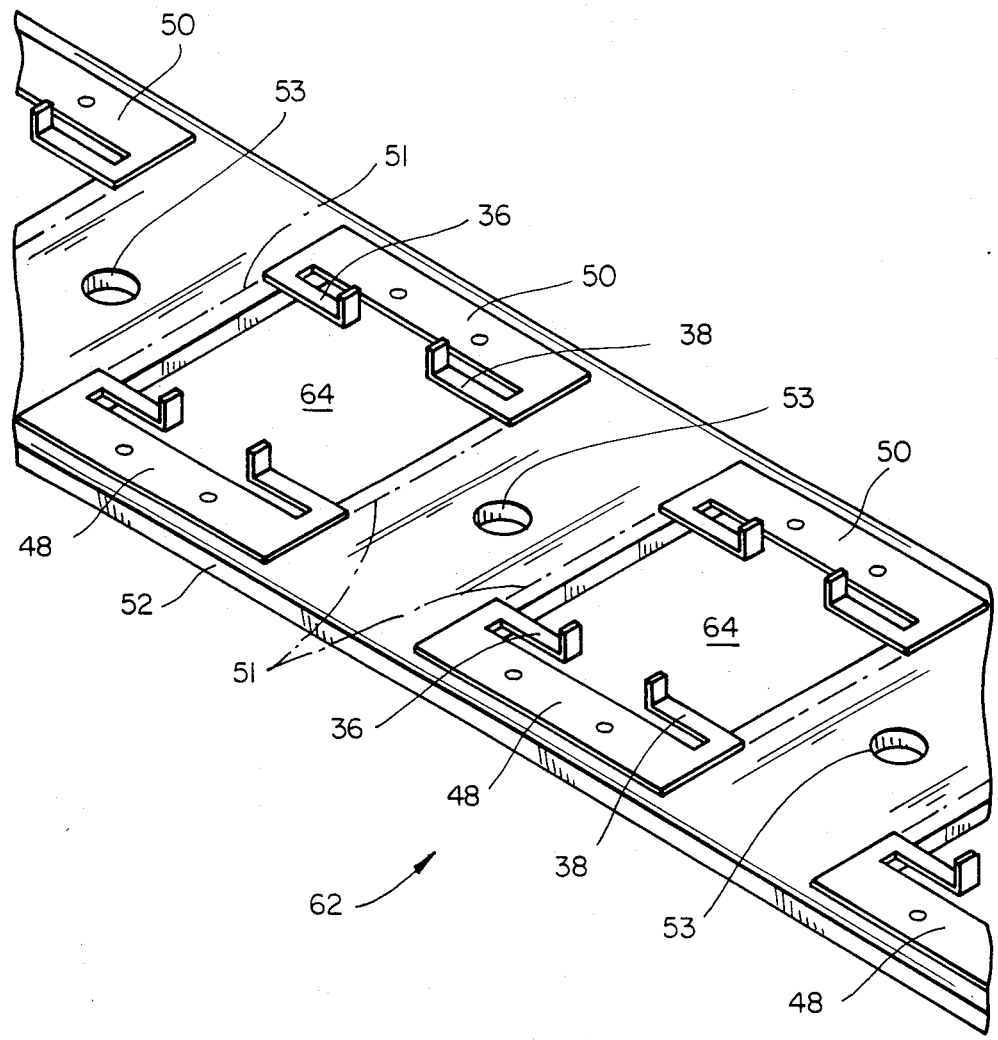
FIG_4

CHIP CARRIER ALIGNMENT DEVICE AND ALIGNMENT METHOD

BACKGROUND OF THE INVENTION

The invention relates in general to a mounting device and method of use for an integrated circuit chip package.

Specfically, the invention relates to castellated chip carriers and their assembly with other electrical components such as other chip carriers, printed circuit boards and the like.

The term "castellated chip carrier" as used herein refers to devices, usually ceramic, used in the electronics industry to mount integrated circuit chips in order to mount them on other electrical components such as printed circuit boards. The chip carrier has a number of fine contact points to which the integrated circuit chip contact points are connected. The carrier contains a number of larger contact pads electrically interconnected with the fine contact points. The pads are typically around the edge or periphery of the chip carrier and are used to connect the chip carrier to the other electrical components such as the printed circuit board. The number of contact pads around the periphery of the chip carrier is typically 24, 44, 52, 68 or other number as dictated by the chip to be mounted on the chip carrier.

The term "castellation" as used herein refers to the vertical grooves along the peripheral edge of the ceramic chip carrier. The castellations are formed by punching holes in the ceramic material from which the chip carrier is made. The holes are uniformly spaced over the range of chip carrier sizes. The ceramic material is then cut or broken along the center line of those holes to form the individual chip carrier. Since the castellations are in effect the remains of the precisely formed holes which are also precisely positioned relative to the contact pads at the periphery of the chip carrier, the castellations are particularly useful in the instant invention in positioning and aligning the chip carrier to connect it with other electrical components.

The remaining portions along the edge of the chip carrier which are cut or broken to form the individual chip carrier are not always precise with respect to the positioning of the individual connection pads at the periphery of the chip carrier. Therefore, these remaining rough edges cannot always be used to provide precise positioning and alignment of the chip carrier with respect to connection to other electrical components.

The mounting devices and methods heretofore provided for such chip carriers generally have been of relatively complicated and expensive construction. These devices have not been readily adaptable for the range of sizes of chip carriers.

SUMMARY OF THE INVENTION

The purpose of the instant invention is to provide a chip carrier alignment device which supports a chip carrier in a fixed dimensional relationship. To accomplish this purpose there is provided a device which compressively engages at least one castellation on at least two sides of a chip carrier, which supports the chip carrier and which positions the chip carrier.

Specifically, there is provided a device for aligning a castellated chip carrier comprising:
 a frame;
 engagement means operatively connected to said frame for compressively engaging at least one castellation in the opposed edges of a castellated chip carrier to be aligned;
 support means operatively connected to said frame to support a chip carrier to be supported in a desired plane; and
 positioning means operatively connected to said frame for aligning the chip carrier to be positioned with respect to at least one other component There is also provided a method of producing a pre-leaded castellated chip carrier comprising the steps of:
 providing a castellated chip carrier having a plurality of contact pads;
 compressively engaging at least one castellation in opposed edges of the carrier;
 providing a generally planar solder column placement device having a body and a plurality of discrete electrically conductive and fusible elements therethrough, said elements generally perpendicular to said plane, said elements being complementary to the contact pads;
 supporting the carrier in a plane parallel to the plane of the solder column placement device;
 positioning the carrier to align the contact pads with the conductive elements;
 heating the carrier and solder column placement device to fuse the conductive elements to the contact pads; and
 removing the body of the solder column placement device to produce a pre-leaded carrier.

There is further provided a method of aligning and assembling a castellated chip carrier to an electrical component comprising the steps of:
 providing a castellated chip carrier having a plurality of contact pads;
 compressively engaging at least one castellation in opposed edges of the carrier;
 providing a solder column placement device having a generally planar body and a plurality of discrete electrically conductive and fusible elements therethrough generally perpendicular to said plane, said elements being complementary to the contact pads;
 supporting the carrier in a plane parallel to the plane of the solder column placement device;
 positioning the carrier to align the contact pads with the conductive elements;
 heating the carrier and mounting device to fuse the conductive elements to the contact pads;
 removing the body of the solder column placement device to produce a pre-leaded carrier;
 providing an electrical component having a plurality of component contact pads;
 supporting the pre-leaded carrier in a plane above the electrical component;
 positioning the pre-leaded carrier to align the conductive elements with respect to the component contact pads; and
 heating the pre-leaded carrier and electrical component to fuse the pre-leaded carrier to the electrical component.

BRIEF DESCRIPTION OF THE DRAWING

FIG. 1 is a perspective exploded view of the chip carrier alignment device of the instant invention positioned above a castellated chip carrier and a solder column placement device.

FIG. 2 is a perspective view of the bottom of a castellated chip carrier which has been pre-leaded by the device of FIG. 1.

FIG. 3 is a partial perspective top view of the chip carrier alignment device of the instant invention engaging the pre-leaded castellated chip carrier of FIG. 2.

FIG. 4 is a partial perspective bottom view of an alternative castellated chip carrier alignment device for multiple carriers.

DESCRIPTION OF PREFERRED EMBODIMENTS

With continued reference to the drawing, FIG. 1 illustrates a device shown generally at 10 for aligning a castellated chip carrier 12 with respect to a solder column placement device 14. It is understood that the device 10 of this invention is equally useful in mounting leaded chip carriers as well as mounting any type of castellated chip carrier on various electrical components such as printed circuit boards, other chip carriers, and the like.

The device 10 for aligning a castellated chip carrier comprises a frame 16 and engagement means 18 operatively connected to the frame 16 for compressively engaging at least one castellation 20 in the opposite edges of a castellated chip carrier 12 to be aligned. The device also includes support means 22 operatively connected to the frame 16 to support a chip carrier in a desired plane. The support means 22 is shown to be a flat fillet area of the frame 16. FIG. 3 more clearly illustrates the support means 22 contacting the corners of the chip carrier.

The device further includes positioning means 24 operatively connected to the frame 16 to align the castellated chip carrier 12 with respect to at least one other component. That other component in FIG. 1 is a solder column placement mounting device 14. The positioning means shown comprises a plurality of precisely punched and positioned holes 24 through which pins (not shown) may be inserted to align the device or the like 10 with the solder column placement device 14 having aligned holes 26.

The engagement means shown generally at 18 comprises a first pair of centering means 28 and 30 and an optional second pair of centering means 32 and 34 connected to the frame 16, the centering means comprising each pair being spaced from each other and being symmetrically disposed with respect to each other to define an opening therebetween in which a castellated chip carrier 12 may be inserted.

Each centering means such as centering means 28 and centering means 30 are compliant in one direction such as that noted at the dimension ΔX to allow for insertion of a castellated chip carrier and are relatively stiff in another direction noted at the dimension ΔY to secure the chip carrier. Each individual centering means such as centering means 28 comprises a pair of opposed cantilevered levers 36 and 38. Each cantilevered lever such as lever 36 has a proximate end 40 and a distal end 42, the levers having long arms in axial alignment with each other and having short arms at the distal end 42. The short arms are at right angles to the long arms, said short arms acting as stiff, flat springs and capable of engaging the castellations of a castellated chip carrier to be inserted to secure the castellated chip carrier. The long arms are compliant in torsion and bending to allow for insertion of a castellated chip carrier.

It is understood that the short arm can be any member which will fit into the castellation in a consistent and repeatable fashion. The member can be a sharp edge, a wedge, or a square edge which is narrower than the diameter of the castellation of a cylindrical member having the same or smaller diameter as the castellation itself. While engaging one castellation on each of two edges of the chip carrier may be sufficient, it is preferred that two castellations be engaged on each respective edge of the chip carrier, and it is further preferred that each of the centering means for compressively engaging a castellation on the chip carrier be positioned to engage a castellation positioned between the corner of the chip carrier such as corner 44 and the center line 46 of the chip carrier. This most preferred aspect of the invention provides superior alignment of the chip carrier with respect to its center-line dimensions measured with respect to the contact pads on the chip carrier.

As mentioned earlier, a second optional pair of centering means 32 and 34 are operatively connected to the frame at right angles to the first pair of centering means 28 and 30 to further define the opening in which a castellated chip carrier may be inserted. In the preferred embodiment, the various centering means are integral with the frame 16. It can be seen in FIG. 4 that the centering means 48 and 50 may be non-integral and only operatively connected to the frame at 52.

The device 10 of FIG. 1 may be used to produce a pre-leaded castellated chip carrier such as that shown in a bottom view in FIG. 2. This is accomplished with the solder column placement device 14. The method of aligning and producing a pre-leaded and castellated chip carrier includes the steps of providing a castellated chip carrier 12 having a plurality of contact pads 54 thereon as can be seen in FIG. 2 where solder columns 58 have been fused to the pads as will be discussed later. The device 10 compressively engages at least one castellation in opposed sides of the carrier 12. The chip carrier 12 whose contact pads 54 have been solder tinned is pressed face-up as shown in FIG. 1 into the device 10. The carrier 12 will snap in between the centering means 28, 30, 32 and 34. The flat face of the carrier 12 will contact the support means 22 to support the carrier 12 in the desired plane.

A solder column placement device 14 having a generally planar body or holder 56 and a plurality of discrete electrically conductive and fusible elements such as solder columns 58 therethrough is provided. The solder columns 58 are generally perpendicular to the plane of the body and the elements are complementary in number and in diametric width to the contact pads 54. A typical solder column placement device is disclosed in commonly assigned U.K. patent application No. GB 2142568A published Jan. 23, 1985 the disclosure which is incorporated herein by reference. The supported carrier is then positioned by holes 24 in device 10 and holes 26 in solder column placement device 14 to align the contact pads with the solder column elements. The carrier 12 should be held snugly against solder column placement 14 device and the entire assembly may be dipped into a liquid flux. The entire assembly is then heated; specifically the carrier and solder column placement device are heated to fuse the solder columns 58 to the contact pads 54. Typically, the assembly should be subjected to a temperature of 220° C. for 60 seconds.

The body 56 of the solder column placement device 14 may then be removed. Typically the carrier and solder column placement device are released from the alignment device 10 and dipped in a solvent to dissolve the body 56 of the solder column placement device 14 leaving the solder columns 58 bonded to contact pads 54 on chip carrier 12. The result is a pre-leaded chip carrier 12' as seen from the bottom in FIG. 2.

FIG. 3 illustrates the pre-leaded chip carrier 12' as seen from the top prior to final assembly of the carrier to an electrical component shown in phantom at 60. Typically, the pre-leaded carrier is connected to an electrical component in the form of a printed circuit board (PCB) having a plurality of component contact pads. The pre-leaded carrier is supported in a plane parallel to that of the electrical component and is positioned with respect to component contact pads by the alignment holes 24 as discussed earlier. Solder paste has been previously applied to the PCB in a similar way to paste applied for other surface-mount devices. The pre-leaded carrier and electrical component are then heated to fuse the pre-leaded carrier to the electrical component. While the solder contained in the solder columns 58 is molten, sidewise vibration and tilt of the carrier should be avoided. The solder should be subjected to a temperature of 220° C. for 60 seconds.

FIG. 4 illustrates in a bottom view an alternative castellated chip carrier alignment device shown generally at 62 for a plurality of carriers (not shown) that may be inserted into the openings 64 and be supported on two edges as shown in phantom by the frame 52. In this embodiment, the engagement means comprises a plurality of pairs of centering means 48 and 50 operatively connected to and recessed in the frame 52, each pair of centering means being spaced from each other and being symmetrically disposed with respect to each other to define an opening therebetween in which carriers may be inserted. The portions 51 shown in phantom of the frame 52 comprise a support means to support respective chip carriers. The indexing holes 53 comprise positioning means to align the chip carriers with respect to other components. The centering means feach comprise pairs of cantilevered levers 36 and 38 as described earlier.

While a preferred embodiment of the present invention has been described, it should be understood that various changes, adaptations and modifications may be made therein without departing from the spirit of the invention and the scope of the appended claims.

What is claimed is:

1. A device for aligning a castellated chip carrier comprising:
    a frame;
    engagement means operatively connected to said frame for compressively engaging at least one castellation in the opposite edges of a castellated chip carrier to be aligned;
    support means operatively connected to said frame to support a chip carrier to be supported in a desired plane; and
    positioning means operatively connected to said frame to align a castellated chip carrier to be positioned with respect to at least one other component.

2. A device as in claim 1 wherein said engagement means comprises a first pair of centering means operatively connected to said frame, said centering means being spaced from each other and being symmetrically disposed with respect to each other to define an opening therebetween in which a castellated chip carrier may be inserted.

3. A device as in claim 2 wherein the centering means is compliant in one direction to allow for insertion of a castellated chip carrier and relatively stiff in another direction to subsequently secure a castellated chip carrier.

4. A device as in claim 3 wherein the centering means each comprise a pair of opposed cantilevered levers each having a proximate end and a distal end, said levers each having long arms in axial alignment with each other and having short arms at the distal ends of said long arms at right angles to said long arms, said short arms acting as stiff flat springs and capable of engaging the castellations of a castellated chip carrier to be inserted to secure the castellated chip carrier and said long arms being compliant in torsion and bending to allow for insertion of a castellated chip carrier.

5. A device as in claim 2 further including a second pair of centering means operatively connected to said frame at right angles to said first pair of centering means to further define the opening in which a castellated chip carrier may be inserted.

6. A device as in claim 5 wherein the centering means is compliant in one direction to allow for insertion of a castellated chip carrier and relatively stiff in another direction to subsequently secure a castellated chip carrier.

7. A device as in claim 6 wherein the centering means each comprise a pair of opposed cantilevered levers each having a proximate end and a distal end, said levers each having long arms in axial alignment with each other and having sort arms at the distal ends of said long arms at right angles to said long arms, said short arms acting as stiff flat springs and capable of engaging the castellations of a castellated chip carrier to be inserted to secure the castellated chip carrier and said long arms being compliant in torsion and bending to allow for insertion of a castellated chip carrier.

8. A device as in claim 2 wherein said frame and said centering means are integral.

9. A device as in claim 3 wherein said frame and said centering means are integral.

10. A device as in claim 4 wherein said frame and said centering means are integral.

11. A device as in claim 5 wherein said frame and said centering means are integral.

12. A device as in claim 1 for aligning a plurality of castellated chip carriers wherein the engagement means comprises pairs of centering means which are operatively connected to the frame, each pair of centering means being spaced from each other and being symmetrically disposed with respect to each other to define an opening therebetween in which castellated chip carriers may be inserted.

13. A device as in claim 12 wherein each centering means is compliant in one direction to allow for insertion of a castellated chip carrier and relatively stiff in the other direction to subsequently secure a castellated chip carrier.

14. A device as in claim 13 wherein each centering means comprises a pair of opposed cantilevered levers, each having a proximate end and a distal end, said levers each having long arms in axial alignment with each other and having short arms at the distal ends of said long arms at right angles to said long arms, said short arms acting as stiff flat springs and capable of engaging the respective castellation of respective castellated chip carriers to be inserted to secure the castellated chip carriers and said long arms being compliant in torsion and bending to allow for insertion of a respective chip carriers.

15. A method of producing a pre-leaded castellated chip carrier comprising the steps of:

provide a castellated chip carrier having a plurality of contact pads;

compressively engaging at least one castellation in opposed sides of the carrier;

providing a solder column placement device having a generally planar body and a plurality of discrete electrically conductive and fusible elements therethrough, said elements being generally perpendicular to said plane, said elements being complementary to the contact pads;

supporting the carrier in a plane parallel to the plane of the solder column placement device;

positioning the carrier to align the contact pads with the conductive elements;

heating the carrier and mounting device to fuse the conductive elements to the contact points; and removing the body of the solder column placement device to produce a pre-leaded carrier.

16. A method of assembling a castellated chip carrier to an electrical component comprising the steps of:

providing a castellated chip carrier having a plurality of contact pads;

compressively engaging at least one castellation in opposed edges of the carrier;

providing a solder column placement device having a generally planar body and a plurality of discrete electrically conductive and fusible elements therethrough generally perpendicular to said plane, said elements being complementary to the contact pads;

supporting the carrier in a plane parallel to the carrier plane;

positioning the carrier to align the contact pads with the conductive elements;

heating the carrier and mounting device to fuse the conductive elements to the contact pads;

removing the body of the solder column placement device to produce a pre-leaded carrier;

providing an electrical component having a plurality of component contact pads;

supporting the pre-leaded carrier in a plane above the electrical component;

positioning the pre-leaded carrier to align the conductive elements with respect to the component contact pads; and heating the pre-leaded carrier and electrical component to fuse the pre-leaded carrier to the electrical component.

* * * * *